United States Patent [19]
Kalidas et al.

[11] Patent Number: 6,084,777
[45] Date of Patent: Jul. 4, 2000

[54] BALL GRID ARRAY PACKAGE

[75] Inventors: Navinchandra Kalidas, Houston; Nozar Hassanzadeh, Plano; Michael A. Lamson, Van Alstyne, all of Tex.

[73] Assignee: Texas Instruments Incorporated, Dallas, Tex.

[21] Appl. No.: 09/065,670

[22] Filed: Apr. 23, 1998

Related U.S. Application Data

[60] Provisional application No. 60/044,173, Apr. 23, 1997.

[51] Int. Cl.$^7$ .......................................... H05K 7/20
[52] U.S. Cl. ............................ 361/707; 257/707; 361/761
[58] Field of Search ...................... 257/659, 698, 257/712, 713, 707, 778, 779, 783; 174/252, 16.3; 165/80.3, 185; 361/760, 761, 764, 767, 768, 704, 705, 707, 709–711, 717–719

[56] References Cited

U.S. PATENT DOCUMENTS

| | | |
|---|---|---|
| 5,397,921 | 3/1995 | Karnezos ................................. 257/779 |
| 5,409,865 | 4/1995 | Karnezos ................................. 437/210 |
| 5,475,565 | 12/1995 | Bhattacharyya . |
| 5,650,662 | 7/1997 | Edwards . |
| 5,701,032 | 12/1997 | Fischer . |
| 5,737,191 | 4/1998 | Horiuchi . |
| 5,796,170 | 8/1998 | Marcantonio . |
| 5,856,911 | 1/1999 | Riley . |

OTHER PUBLICATIONS

Marketing Brochure, "Super BGA®" Amkor/Anam, unnumbered 3 pages.
Paper, "Super BGA® Designing for Enhanced Performance," by Carmen Mattei and Robert Marrs, unnumbered 16 pages.
Marketing Brochure, "Super BGA® Product Overview," Dec. 18, 1995, pp. 1–22.

*Primary Examiner*—Gerald Tolin
*Attorney, Agent, or Firm*—Mark A. Valetti; Carlton H. Hoel; Richard L. Donaldson

[57] ABSTRACT

A ball grid array package (10) is provided that includes a heat spreader (14), a stiffener (13), a substrate (16), and a die or chip (12). The stiffener (13) is mounted to the heat spreader (14) and has a cavity formed therein. The stiffener (13) may serve as either a ground plane or a power plane of ball grid array package (10), depending on the desired implementation. The substrate (16) includes a signal plane (30) and a power bus (28) on a first surface and has a cavity formed therein. The substrate (16) is mounted to the stiffener (13) through a second surface. The substrate (16) further having at least one hole formed from the first surface to the second surface and a plurality of solder balls, similar to solder ball (20), to provide an external connection to the ball grid array package (10). Finally, the chip (12) is mounted to portion of the heat spreader (14) exposed through the cavity of the substrate (16) and the stiffener (13) and wire bonded to the various electrical planes, including the stiffener (13). The present invention also provides a method (100) for forming the ball grid array package (10) of the present invention.

14 Claims, 2 Drawing Sheets

BALL GRID ARRAY PACKAGE

This application claims priority under 35 USC § 119(e)(1) of provisional application Ser. No. 60/044,173 filed Apr. 23, 1997.

TECHNICAL FIELD OF THE INVENTION

This invention relates generally to the field of semiconductor device packaging, and more particularly to a ball grid array package and method.

BACKGROUND OF THE INVENTION

The use of ball grid arrays (BGAs) to package electronic circuits and devices such as semiconductor dies or integrated circuit chips is becoming more prevalent. BGA packaging has proven to provide substantial advantages over other packaging techniques such as, for example, dual in-line packages (DIPs), pin grid array (PGA) packages, tape carrier packages (TCPs), and quad flat packs (QFPs). The advantages of BGA packaging become especially significant when used to package dies or chips having a high pin count and when used to package devices employing high frequency signals. BGA packaging provides the additional advantage of being able to use conventional surface mount technologies (SMTs) and assembly techniques when mounting BGA packages to a printed circuit board (PCB).

A BGA package generally includes a die or chip, multiple substrate layers, and a heat spreader. The die is generally mounted on the heat spreader/stiffener using a thermally conductive adhesive or glue such as an epoxy. The heat spreader/stiffener provides thermal protection by increasing the conduction of heat away from the die to improve thermal performance. For example, absent appropriate heat removal mechanisms, the temperature within and around a typical die may increase to an undesirable level during normal operation, leading to reduced electrical performance or even failure of the device. The heat spreader/stiffener also provides structural and mechanical support by acting as a stiffener to provide added rigidity to the BGA package and thus may be referred to as a heat spreader/stiffener.

One of the substrate layers includes a signal plane that provides various signal lines or traces that can be coupled to a corresponding die bond pad using a wire bond. The signal traces are then coupled with a solder ball at the other end. As a result, an array of solder balls is formed so that the BGA package may be electrically and mechanically coupled to other circuitry, generally through a PCB, using the array of solder balls that is referred to as a ball grid array. Additionally, a ground plane will generally be included on one of the substrate layers to serve as an active ground plane to improve overall device performance by lowering the inductance, providing controlled impedance, and reducing cross talk. This is especially important when using BGA packaging with a die or chip having a high pin count or I/O count.

The fabrication of the ground plane is both expensive and time consuming but necessary to the overall performance of the device. The ground plane is generally constructed using a conductive metal such as copper and may include gold plating. These metals further add to the expense of fabricating the ground plane in a BGA package.

The complexity and cost of BGA packages are also influenced by the number of interconnections or vias that must be provided in the substrate layers to provide a path to connect each of the solder balls to either the ground plane, the power plane, or desired signal leads of the signal plane. In general, multiple substrate layers and multiple vias result in lower BGA package fabrication yields and higher costs. The formation of the vias create additional complexity and cost because each of the vias generally require the formation of a conductive layer, such as a metal layer on the internal walls of the via, to ensure a complete electrical path. This may be referred to as metallization. The metallization of the internal walls of each via increases the overall complexity and cost of manufacturing BGA packages.

Prior attempts at solving some of the problems mentioned above fail to satisfactorily solve the problem and suffer other disadvantages. For example, in U.S. Pat. Nos. 5,397,921 and 5,409,865 to Karnezos, a tape automated bonding grid array package is shown that uses a metallic heat spreader that also serves as a ground connection. The die of such a package must be mounted in a cavity of the heat spreader. The cavity is generally expensive to form or etch to a desired depth and contributes to the overall cost of the package. Also, the packaging configuration prevents the use of the heat spreader as a power plane or as a power connection point due to the dangers of an external short of the heat spreader.

SUMMARY OF THE INVENTION

From the foregoing it may be appreciated that a need has arisen for a ball grid array package and method that eliminate or reduce the problems of prior techniques by eliminating the need to form a cavity in a heat spreader or a heat spreader/stiffener to a particular depth, while using a stiffener to serve as either a power plane or a ground plane. In accordance with the present invention, a ball grid array package and method are provided which substantially eliminate the disadvantages and problems outlined above.

According to the present invention, a ball grid array package is provided. The ball grid array package includes a heat spreader, a stiffener, a substrate, and a die. The stiffener includes a cavity formed therein and is mounted to the heat spreader. The stiffener may serve as either a ground plane or a power plane, depending on the desired implementation. The substrate includes a first surface, a second surface, and a cavity formed therein and has a signal plane and either a power plane or a ground plane on the first surface. The substrate is mounted to the stiffener through the second surface. The substrate also includes at least one hole formed from the first surface to the second surface and a plurality of solder balls to provide an external connection to the ball grid array package. The die is mounted to a portion of the heat spreader exposed through the cavity provided in the stiffener and substrate and includes a signal die bond pad coupled to the signal plane, a power die bond pad coupled to the power plane, and a ground die bond pad coupled to the ground plane. Once again, the stiffener may serve as either the ground plane or the power plane depending on a desired implementation.

According to another aspect of the present invention, a method for forming a ball grid array package is provided. The method includes the steps of providing a metallized substrate having a first surface, a second surface, and a cavity formed therein. The first surface having a metal layer. The method further includes the steps of forming a first plane, such as a signal plane, and a second plane, such as a power plane or a ground plane, using the metal layer provided on the first surface of the substrate. The method also includes forming interconnect holes or vias through the substrate, that may or may not include metallization of the inner walls of the holes or vias, and mounting the substrate to a stiffener through the second surface. Finally, the method includes mounting a die to the heat spreader through the cavity in the substrate and coupling a die bond pad of the die to the stiffener.

The present invention provides a myriad technical advantages. A technical advantage of the present invention includes the elimination of the need to form a cavity in a heat spreader to a particular depth. This reduces the overall cost of manufacturing a BGA package. Another technical advantage of the present invention includes the use of a stiffener to serve as either a power plane or a ground plane. In one embodiment, the stiffener serves as the power plane, and in another embodiment, the stiffener serves as the ground plane. The use of a stiffener reduces the overall complexity and cost of fabricating a BGA package. Another technical advantage of the present invention includes the elimination or minimization of numerous substrate interconnections and vias. Still yet another technical advantage of the present invention includes the elimination of the need to provide metallization of the internal walls of any substrate holes or vias that may be required. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
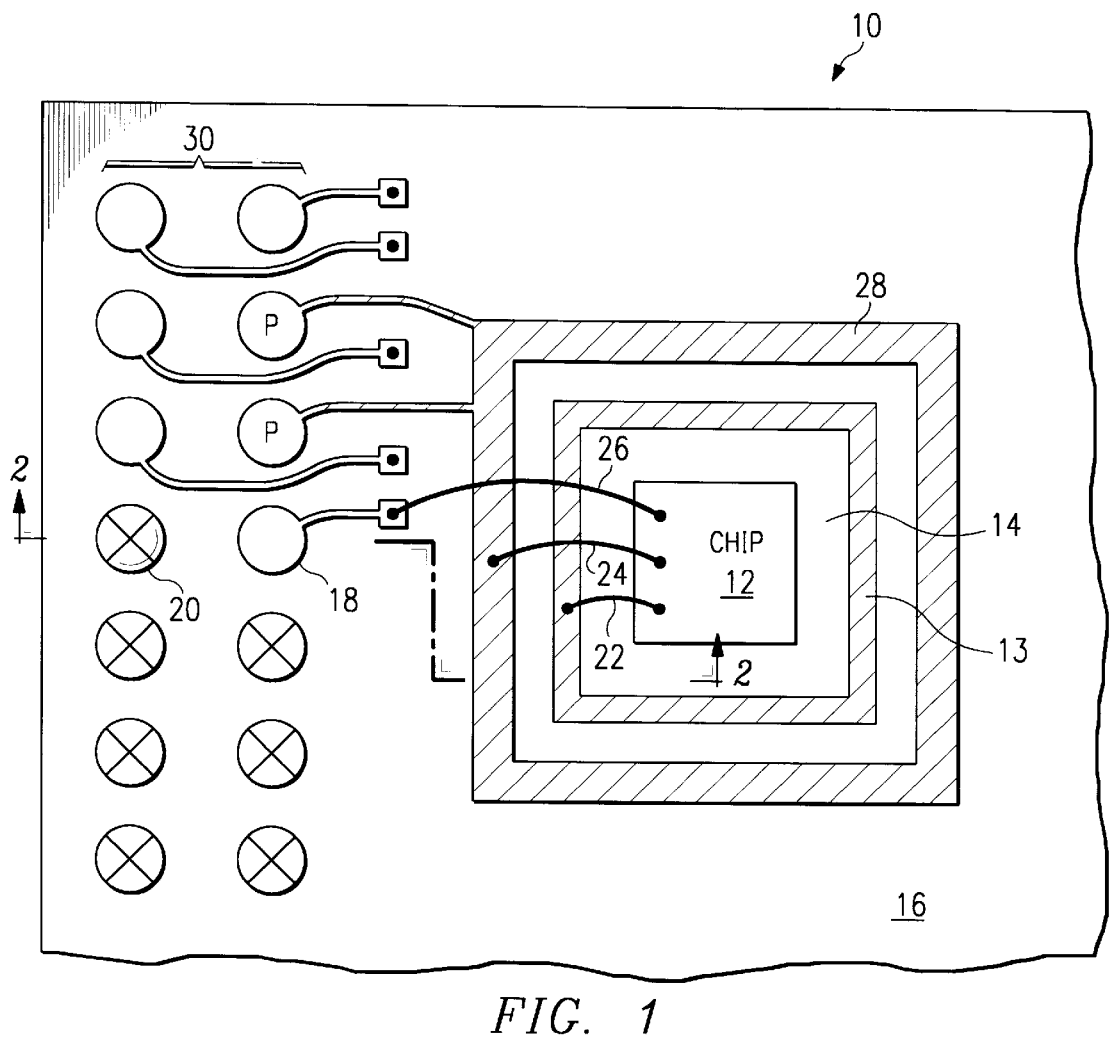
FIG. 1 is a top view of an exemplary ball grid array package according to the teachings of the present invention.

FIG. 1 is a top view of an exemplary ball grid array package 10 that is provided according to the teachings of the present invention. Ball grid array package 10 includes an integrated circuit die or chip 12 that is mounted on a heat spreader 14 through a cavity in a substrate 16. Substrate 16 includes a power bus 28, a signal plane 30, which includes various signal traces or leads such as a signal trace 18, and various ground interconnections or points. The array of circles shown in FIG. 1 are representative of the various points that will ultimately be coupled to a solder ball to provide an external electrical connection to ball grid array package 10. Each of these solder balls will provide electrical connections to either signal plane 30, power bus 28, or a stiffener 13 which serves as a ground plane. Stiffener 13 is illustrated more fully in FIG. 2. It should also be noted that the ball grid array of solder balls will generally be provided around the periphery of substrate 16. This is not illustrated in FIG. 1 so that the present invention may be illustrated more clearly.

The ground points are illustrated on the top surface of substrate 16 and are indicated with an "X." Each of these individual ground points will eventually have an associated solder ball attached. For example, a solder ball 20 is shown provided at a ground point. Solder ball 20 is illustrated more fully in FIG. 2. Each of the solder balls of the various ground points are electrically coupled to stiffener 13, which serves as the ground plane of ball grid array package 10. The electrical path between each of the solder balls and the stiffener is provided, in one embodiment, using the solder ball itself. In such a case, the solder ball extends through a hole formed through substrate 16 to stiffener 13. This is also illustrated more fully in FIG. 2.

The circular traces extending from power bus 28 and denoted with the letter "P" are examples of power points that will ultimately be provided with a solder ball to provide an external power connection to each of these points. It should also be noted that ultimately each of the circular portions of each of the signal traces of signal plane 30 and the various power points will also include a solder ball, such as solder ball 20, for providing external electrical connections to each of the signal points and power points of ball grid array package 10.

Before proceeding further, it should be understood that the illustration of ball grid array package 10 of FIG. 1 is merely one implementation of the present invention and the present invention is in no way limited to this one illustration. For example, the arrangement and configuration of the various signal traces of signal plane 30 and the placement and configuration of the various grounding interconnections may be provided in any desired or advantageous arrangement or configuration. As mentioned above, ball grid array package 10 will generally include an array of solder balls that extend around the periphery of substrate 16. For clearer illustration, only one side of the array of solder balls is shown. It should also be understood that although power bus 28 is generally shown in a ring or rectangular configuration on the first surface of substrate 16, power bus 28 may be provided in any convenient configuration. Furthermore, in alternative embodiments of ball grid array package 10, power bus 28 will serve as the ground plane while stiffener 13 will serve as the power plane.

Chip 12 may be mounted to heat spreader 14 using any available adhesive or epoxy. Chip 12 is mounted within the cavity of stiffener 13 and substrate 16. Chip 12 includes various die bond pads that are used to provide couplings for interconnections to either signal plane 30, power bus 28, or stiffener 13, which serves as the ground plane in the one embodiment illustrated in FIG. 1. The interconnection to signal plane 30 will be provided through a signal trace such as signal trace 18. For illustrative purposes, only three die bond pads of chip 12 are shown to illustrate each of the potential connections. These connections are generally made using wire bonds, such as gold wire bonds.

A first die bond pad is shown coupled to stiffener 13 through wire bond 22 to provide a ground connection to the first die bond pad. In this manner, any die bond pad of chip 12 which serves as a ground point only needs to be coupled to stiffener 13. This provides a convenient and reliable means to electrically couple ground die bond pads of chip 12 to ground and is shown more clearly in FIG. 2. For example, a complete ground connection is provided to a ground die bond pad of chip 12 through wire bond 22 coupling to stiffener 13, and a solder ball, such as solder ball 20, coupling to stiffener 13 through an interconnection hole or via provided in substrate 16 at a ground point. In this manner, solder ball 20 serves as both an external connection to ball grid array package 10 and as the electrical connection through the associated via to stiffener 13. By using the solder ball to provide the electrical connection through substrate 16, the internal walls of the hole or via in substrate 16 do not have to be metallized. This provides substantial advantages in overall fabrication costs.

A second die bond pad is coupled to power bus 28 using a wire bond 24. This provides a convenient connection for each die bond pad requiring a power plane connection. A third die bond pad of chip 12 is coupled to signal plane 30 using a wire bond 26. Wire bond 26 couples from the third die bond pad to signal trace 18 where a solder ball, not shown in FIG. 1, will eventually be provided to supply an external electrical connection to the third die bond pad. Of course, in an actual implementation, each of the signal trace lines of signal plane 30 will be coupled to a corresponding die bond pad of chip 12.

Figure 2:
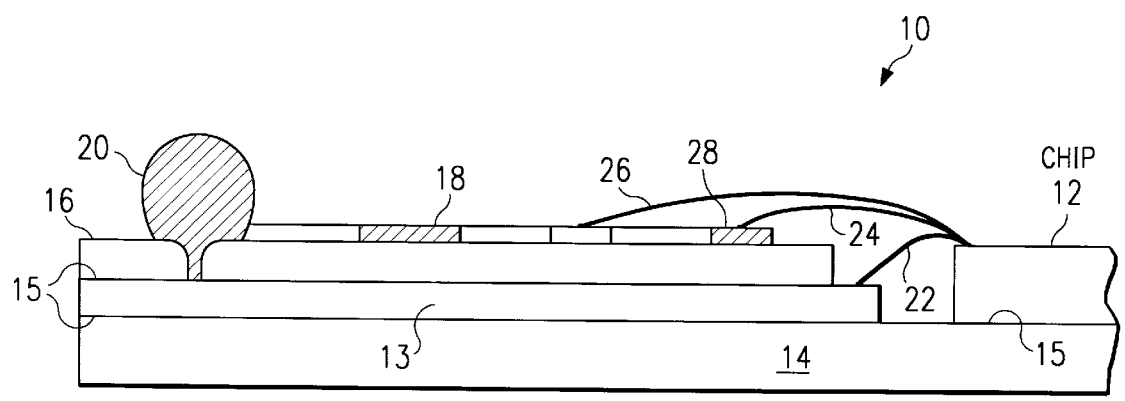
FIG. 2 is a sectional view of the ball grid array package taken along line 2—2 of FIG. 1.

FIG. 2 is a sectional view of ball grid array package 10 taken along line 2—2 of FIG. 1. In this view, wire bond 22 is shown coupled between stiffener 13 and the first die bond pad of chip 12. Similarly, wire bond 24 is shown coupled between power bus 28 and the second die bond pad of chip 12. Finally, wire bond 26 is clearly shown coupled between the third die bond pad and signal trace 18 of signal plane 30.

Chip 12 and stiffener 13 are shown mounted to a surface of heat spreader 14, while substrate 16 is shown mounted to another surface of stiffener 13. Chip 12, stiffener 13, and substrate 16 are preferably mounted using an adhesive 15 or an epoxy. However, it should be understood that these elements may be mounted using any available, known, or equivalent method for mounting. Substrate 16 will generally have a first surface and a second surface and will include a dielectric layer, such as a polyimide film, and a metal layer, such as a copper metal layer. The metal layer will generally be provided on the first surface of substrate 16 and will serve as power bus 28, signal plane 30, and the various ground interconnections or points. Stiffener 13 will include a conductive material so that it may serve as either the ground plane or power plane of ball grid array package 10. For example, stiffener 13 may be fabricated from copper plated with gold, palladium, and the like that serves as a conductor and provides mechanical rigidity to ball grid array package 10. Stiffener 13 will preferably not be electrically coupled to heat spreader 14.

Solder ball 20 is shown providing the grounding interconnection as discussed above. Solder ball 20 is shown extending from the upper surface of substrate 16 down to stiffener 13 so that an electrical connection is made to heat spreader 14, which serves as the ground plane. Solder ball 20 extends through substrate 16 through a hole or via as is shown in FIG. 2. This hole or via may be formed using any available method such as drilling or etching. In other embodiments of the present invention, the holes or vias may be metallized so that the solder ball does not have to extend completely through substrate 16 to complete the electrical connection.

It should be noted that the only holes or vias required in ball grid array package 10 are those needed to electrically couple the solder balls that serve as grounding interconnections with stiffener 13. All other solder balls need only connect with the signal trace lines of signal plane 30 or the circular traces that serve as the power points and couple to power bus 28. In this manner, the overall number of holes or vias are minimized and those that are required do not need to be provided with metallized internal walls. Furthermore, a separate ground plane does not have to be provided since stiffener 13 serves as both the ground plane and as a mechanical stiffener to provide rigidity to ball grid array package 10 and to prevent ball grid array package 10 from warping. As such, the present invention provides significant advantages over prior techniques and significantly reduces overall EGA packaging costs.

Heat spreader 14 provides desirable thermal properties to ball grid array package 10 by providing a thermal path to remove heat generated by chip 12. Heat spreader 14, in the one embodiment of FIG. 2, is provided as a substantially flat member without a cavity having to be formed therein. This provides substantial advantages over prior techniques because of the elimination of the requirement that a cavity must be formed in heat spreader 14. However, it should be understood that the present invention is not limited to only flat or substantially flat implementations of heat spreader 14 without cavities. Heat spreader 14 may be provided with a cavity formed therein if desired. Heat spreader 14 may be implemented using copper or an alloy.

Ball grid array package 10 allows stiffener 13 to serve as either the ground plane or the power plane. As illustrated, stiffener 13 will be substantially enclosed within ball grid array package 10, especially after chip 12 is encapsulated in a later step. This provides the added advantage of using an existing packaging component, stiffener 13, that is not susceptible to being externally shorted. This advantage is not provided if, for example, heat spreader 14 were used as either the ground plane or power plane. The fact that stiffener 13 is not susceptible to being externally shorted when in use as either a ground plane or a power plane provides the advantage of greater device reliability due to the reduction in the risk of an external short that may destroy or damage chip 12.

Figure 3:
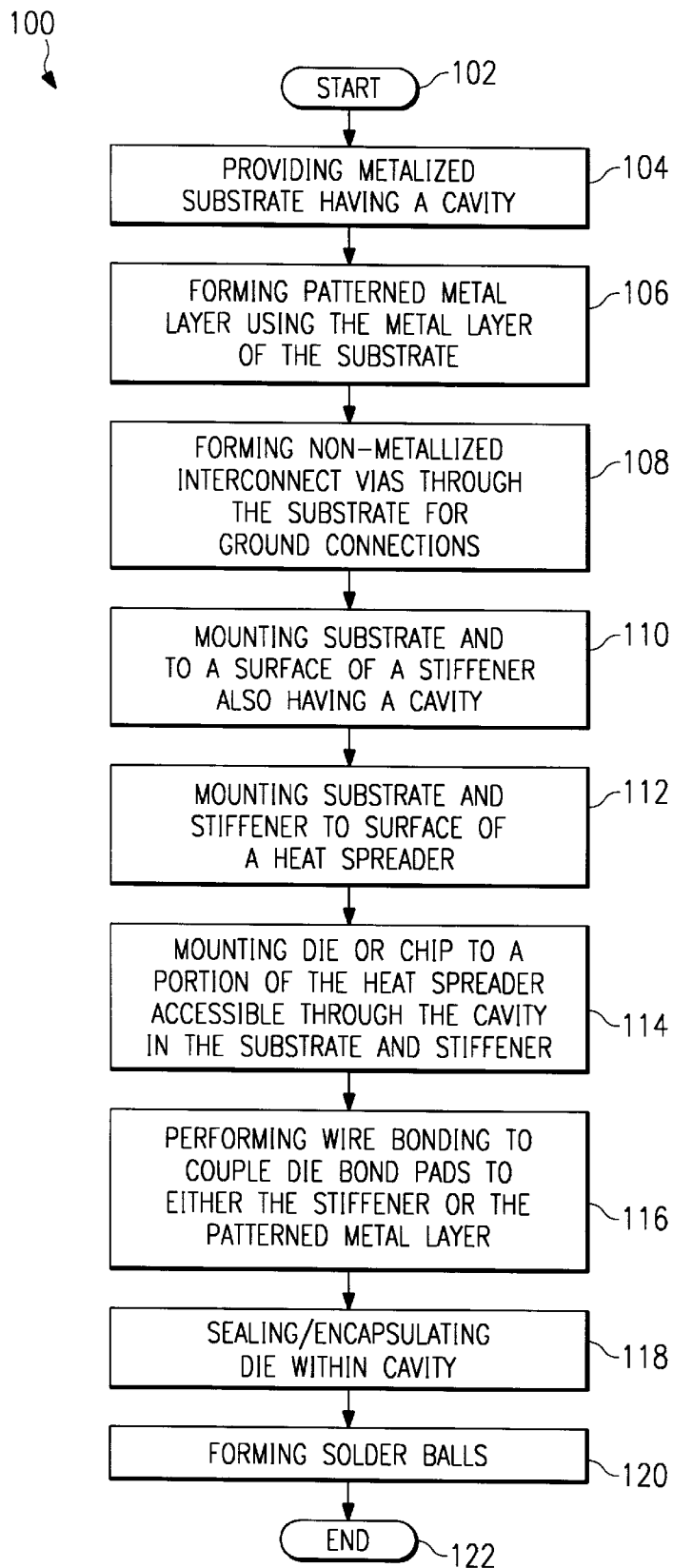
FIG. 3 is a flowchart illustrating an exemplary method for forming a ball grid array package according to the teachings of the present invention.

FIG. 3 is a flowchart illustrating an exemplary method 100 for forming a ball grid array package according to the teachings of the present invention. Method 100 begins as step 102 and proceeds next to step 104 where a one-metal layer substrate is provided that includes a cavity, such as the cavity illustrated in FIGS. 1 and 2. At step 106, the metal layer of the substrate is patterned to form a desired signal plane, having various signal traces or lines, and a power plane. In alternative embodiments of method 100, a ground plane may be formed on the metal layer of the substrate instead of forming a power plane. In such a case, the stiffener will then serve as the power plane. However, in this description, method 100 assumes that a signal plane and a power plane are formed using the metal layer of the substrate in step 106.

At step 108, non-metallized interconnect vias or holes are formed through the substrate to provide grounding interconnections at desired locations. At step 110, the non-metal side of the substrate is mounted to a surface of a stiffener which also has a cavity. As was mentioned above, any available adhesive or mechanism may be used for mounting. Preferably, the cavity of the substrate and the cavity of the stiffener will be aligned in some manner. At step 112, the stiffener is mounted to the surface of a heat spreader. Generally, the substrate will be mounted to the stiffener before the stiffener is mounted to the heat spreader, however, the present invention is not limited to any particular process or order of mounting.

Proceeding next to step 114, the die or chip is mounted to a heat spreader at a point that is accessible through the cavity in the substrate and the stiffener. At step 116, wire bonding is performed to connect each of the various die bond pads of the chip to either a corresponding signal trace of the signal plane, the power plane, or the stiffener that serves as the ground plane in this embodiment. It should be noted that one of the advantages of using a BGA package is its ability to handle electronic devices or circuits requiring numerous I/O connections or pins In some cases, the number of die bond pads may range in the hundreds to thousands. It should also be noted that the die or chip used in the present invention may actually be a microelectronic mechanical system (MEMS). At step 118, the die may be sealed or encapsulated using any known or available technique. At step 120, solder balls may then be attached to the surface of the substrate to provide external connections to the BGA package, including ground, power, and signal connections. This results in a ball grid array which may be provided in virtually any configuration or format. Finally, the method ends at step 122.

Thus, it is apparent that there has been provided, in accordance with the present invention, a ball grid array package and method that satisfy the advantages set forth above. Although the preferred embodiment has been described in detail, it should be understood that various and numerous changes, substitutions, and alterations can be made herein without departing from the scope of the present invention. For example, although the present invention has been primarily described and illustrated with the stiffener serving as a ground plane, the present invention also encompasses the use of the stiffener as a power plane. Also, the number and arrangement of grounding leads or solder balls coupled to the grounding plane may be provided in any arrangement without departing from the present invention. Furthermore, the direct connections illustrated herein could be altered by one skilled in the art such that two components or elements are merely coupled to one another through an intermediate device or devices, without being directly connected, while still achieving the desired results demonstrated by the present invention. Other examples of changes, substitutions, and alterations are readily ascertainable by one skilled in the art and could be made without departing from the spirit and scope of the present invention as defined by the following claims.

What is claimed is:

1. A ball grid array package comprising:
   a heat spreader;
   a stiffener having a cavity formed therein and mounted to the heat spreader but said stiffener is electrically isolated from said heat spreader, the stiffener serving as a ground plane;
   a substrate having a first surface, a second surface, and a cavity formed therein, the substrate having a signal plane and a power plane on the first surface and mounted to the stiffener through the second surface, the substrate further having at least one hole formed from the first surface to the second surface and a plurality of solder balls to provide an external connection to the ball grid array package;
   a die mounted to a portion of the heat spreader exposed through the cavity provided in the stiffener, the die having a signal die bond pad coupled to the signal plane, a power die bond pad coupled to the power plane, and a ground die bond pad coupled to the stiffener which serves as the ground plane;
   and wherein at least one of said solder balls is mounted on said at least one hole in said substrate so as to form a connection with said stiffener through said at least one hole in said substrate.

2. The ball grid array package of claim 1, wherein each of the plurality of solder balls couples to either the signal plane, the power plane, or the stiffener.

3. The ball grid array package of claim 2, wherein the plurality of solder balls is provided on the first surface of the substrate and at least one of the plurality of solder balls couples to the stiffener through the at least one hole formed in the substrate from the first surface to the second surface.

4. The ball grid array package of claim 3, wherein the at least one hole formed in the substrate is not metallized.

5. The ball grid array package of claim 1, wherein the plurality of solder balls are provided as an array of solder balls on the first surface.

6. The ball grid array package of claim 1, wherein the die is encapsulated.

7. The ball grid array package of claim 1, wherein the cavity of the substrate and the cavity of the stiffener are aligned so that at least a portion of the cavity in the substrate resides over the cavity in the stiffener.

8. The ball grid array package of claim 1, wherein the cavity of the substrate is larger than the cavity of the stiffener.

9. The ball grid array package of claim 1, wherein the heat spreader is substantially flat.

10. The ball grid array package of claim 1, wherein the stiffener includes copper.

11. A ball grid array package comprising:
    a heat spreader;
    a stiffener having a cavity formed therein and mounted to the heat spreader but said stiffener is electrically isolated from said heat spreader, the stiffener serving as a power plane;
    a substrate having a first surface, a second surface, and a cavity formed therein, the substrate having a signal plane and a ground plane on the first surface and mounted to the stiffener through the second surface, the substrate further having at least one hole formed from the first surface to the second surface and a plurality of solder balls to provide an external connection to the ball grid array package; and
    a die mounted to a portion of the heat spreader exposed through the cavity provided in the stiffener, the die having a signal die bond pad coupled to the signal plane, a ground die bond pad coupled to the ground plane, and a power die bond pad coupled to the stiffener which serves as the power plane;
    and wherein at least one of said solder balls is mounted on said at least one hole in said substrate so as to form a connection with said stiffener through said at least one hole in said substrate.

12. The ball grid array package of claim 11, wherein each of the plurality of solder balls couples to either the signal plane, the ground plane, or the stiffener.

13. The ball grid array package of claim 12, wherein the plurality of solder balls is provided on the first surface of the substrate and at least one of the plurality of solder balls couples to the stiffener through the at least one hole formed in the substrate from the first surface to the second surface.

14. The ball grid array package of claim 13, wherein the at least one hole formed in the substrate is not metallized.

* * * * *